Figure 1:
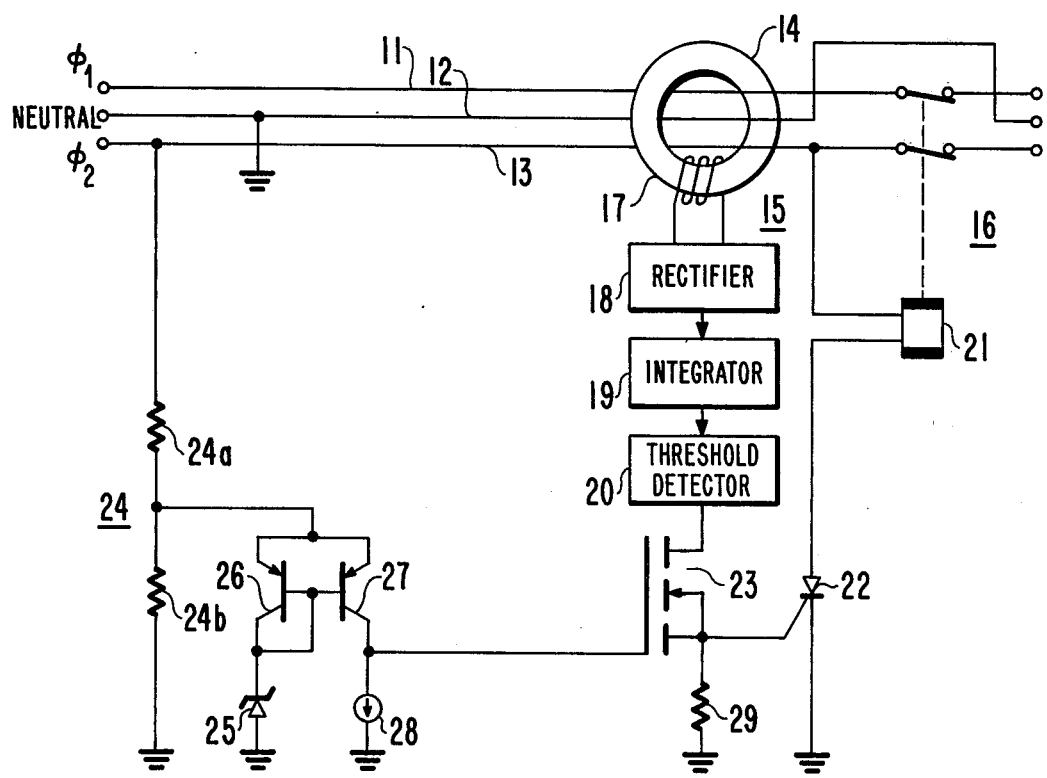

United States Patent [19]
Schade, Jr.

[11] 4,045,822
[45] Aug. 30, 1977

[54] GROUND FAULT INTERRUPTER APPARATUS

[75] Inventor: Otto Heinrich Schade, Jr., North Caldwell, N.J.

[73] Assignee: RCA Corporation, New York, N.Y.

[21] Appl. No.: 682,456

[22] Filed: May 3, 1976

[51] Int. Cl.² ............................................. H02H 3/28
[52] U.S. Cl. .................................. 361/45; 307/252 N
[58] Field of Search ...................... 307/252 N, 235 E; 317/9 C, 18 D

[56] References Cited
U.S. PATENT DOCUMENTS 3,963,963  6/1976  Schade, Jr. ........................ 317/18 D Primary Examiner—Harry E. Moose, Jr.
Attorney, Agent, or Firm—H. Christoffersen; S. Cohen; A. L. Limberg

[57] ABSTRACT

In a ground fault interrupter in which the relay switch for interrupting current through a-c lines has its actuating coil selectively connected by a controlled rectifier to receive a-c line power, a tendency towards relay switch chatter is suppressed by preventing the initiation of controlled rectifier conduction during the rapidly collapsing portions of the a-c power cycle.

6 Claims, 2 Drawing Figures

GROUND FAULT INTERRUPTER APPARATUS

The invention relates to improved ground fault interrupter (GFI) apparatus.

Ground fault interrupter apparatus interrupts the flow of currents through a set of a-c line conductors whenever a ground fault occurs which produces a sufficiently sustained difference between the currents flowing to and from a load via the conductors. It is desirable that the electromechanical relay switch which interrupts the current flow, does not "chatter"—that is, does not cycle between closed and open positions immediately after it first opens. Such "chatter" can place undue mechanical stress on the switch and can hasten the erosion of its contacts. Prolonged chatter may cause overheating of the winding of the relay switch coil, resulting in switch failure.

In certain GFI apparatus, a silicon controlled rectifier controls the application of actuating current from the a-c lines to the relay switch. Whenever a ground fault occurs, the resulting imbalance in the currents flowing to and from a load through a set of line conductors is sensed using a differential current transformer. The transformed imbalance current is rectified, which rectification typically is a half-wave rectification carried out using a synchronous detector switched at line frequency, and the rectified signal is applied to an integrator to develop an integrated signal. When a comparator determines that the integrated signal exceeds a threshold level, it provides a ground fault indication suitable for governing the application of gate signal to the controlled rectifier for switching it into conduction.

The present inventor has found such GFI apparatus to be susceptible to relay switch chatter when a ground fault occurs which causes the integrated signal to barely exceed the threshold level, and that immunity to such chatter is obtained by inhibiting the application of gate signal to the controlled rectifier during the rapidly collapsing, later portion of the actuating current half cycle.

Figure 2:
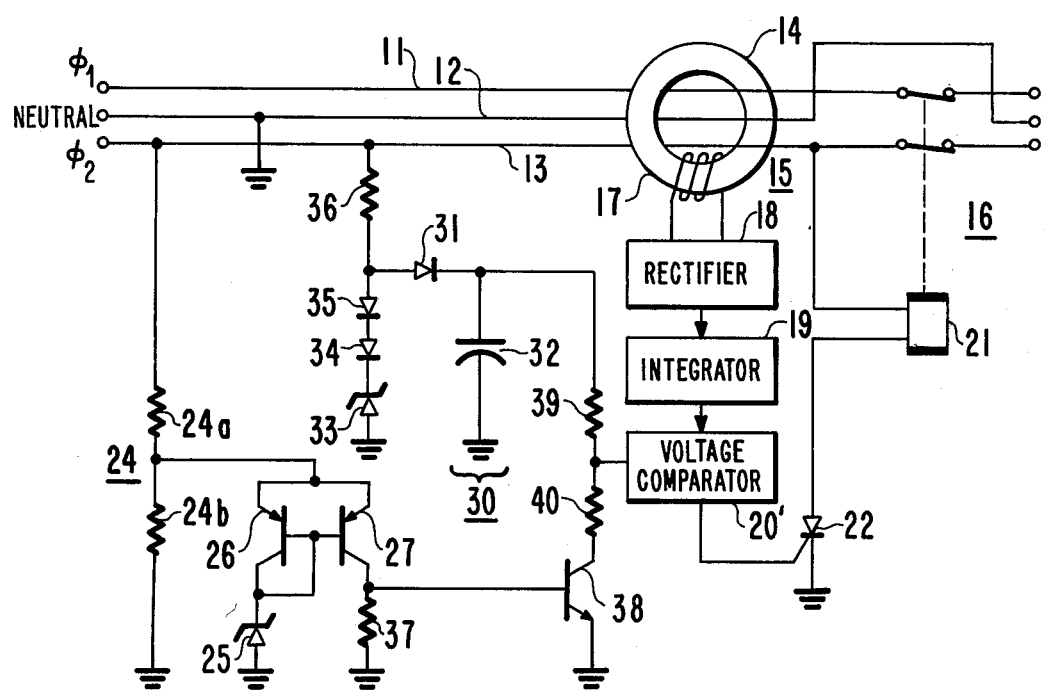

Each of FIGS. 1 and 2 of the drawing is a schematic diagram, partially in block form, of GFI apparatus embodying the present invention.

The GFI apparatus is shown used with a three-wire grounded neutral system having a set of line conductors 11, 12, 13 threaded the core 14 of a differential current sensing transformer 15. Conduction through oppositely phased line conductors 11 and 13 can be interrupted during ground fault conditions by relay switch 16, and conductor 14 is a neutral ground conductor. As is well known, other forms of power transmission, even multiphase forms, can be used with the GFI apparatus with appropriate small modifications.

The secondary winding 17 of the differential current transformer 15, which winding is sometimes referred to as the "sensing coil", senses any imbalance between on the one hand, the currents flowing from left to right in conductors 11, 12, 13 and, on the other hand, the currents flowing from right to left in conductors 11, 12, 13. The transformed imbalance current is provided to a rectifier 18, which responds with a rectified signal. Rectifier 18 typically comprises a synchronous detector arranged to provide half-wave rectification, being switched at line frequency. The rectified signal from rectifier 18 is applied to an integrator 19, and the integrated signal provided responsive to this rectified signal is applied to a threshold detector 20. When threshold detector 20 determines that the integrated signal exceeds a threshold level, it provides a ground fault indication.

Conventionally, integrator 19 comprises a capacitor fed rectified currents by rectifier 18, and threshold detector 20 comprises a simple voltage comparator. Integrator 19 is used to reduce the likelihood of the GFI apparatus responding to line transients or otherwise to interrupt conduction through the line conductors—i.e., to prevent so-called "nuisance tripping" of the relay switch 16. To prevent the integration of line transients and other noise providing, in time, a sufficiently large integrated signal to exceed threshold level, integrator 19 must be arranged to lose integrated information with time. It is often arranged that this loss of integrated information takes place during alternative half cycles of a-c line frequency, which half cycles alternate with those in which the half-wave rectification of imbalance current takes place.

The actuating coil 21 of relay switch 16 is serially connected with a controlled rectifier 22 between neutral conductor 12 and one of the line conductors 13. When controlled rectifier 22 is rendered conductive, an actuating current flows in the actuating coil 21 of relay switch 16 causing the opening of the conductors 11 and 13. In the prior art GFI apparatus, conduction in controlled rectifier 22 would be initiated by ground fault indication supplied from the threshold detector 20 and applied directly to the gate electrode of controlled rectifier 22.

The present inventor has found that relay switch chatter occurs in GFI apparatus of this sort when a ground fault is just serious enough to cause an integrated signal that marginally exceeds threshold level, and has also found the reasons for the chatter. When the integrated signal only marginally exceeds threshold level, gate signal is applied to the controlled rectifier in that portion of the actuating current cycle where current is rapidly collapsing that is, late in each half cycle of actuating current. This is because the loss of information from the integrator on the previous half cycle will have to be made up during the earlier portions of the actuating current cycle in which current is either building up or slowly collapsing. The present inventor found that rendering the controlled rectifier conductive late in the actuating current half cycle, when the current is rapidly collapsing, results in the controlled rectifier not supplying enough energy to completely actuate the relay switch before conduction is extinguished in the controlled rectifier. This partial actuation of the relay switch tends to repeat itself, cycle after cycle, resulting in relay switch chatter.

GFI apparatus modified to embody the present invention includes means for inhibiting the application of the gate signal to the controlled rectifier during the late portions of the actuating current half-cycle, when the available actuating current is rapidly collapsing. This assures that the controlled rectifier when rendered conductive will deliver to the relay switch an actuating current of sufficient amplitude and duration to guarantee completed actuation of the relay switch and forestall chatter. There is a concomitant slight loss in the sensitivity of the GFI apparatus, which can easily be made up for at the other points in the system.

In FIG. 1, the means for inhibiting the application of gate signal to controlled rectifier during the late portions of the actuating current half cycle is provided by field effect transistor 23, the channel of which selectively connects the output of threshold detector 20 to the gate electrode of controlled rectifier 22. When the neutral-to-line potential between conductors 12, 13 as divided down by resistive potential divider 24 comprising resistors 24a, 24b exceeds the combined offset potentials to be expected across the series combination of avalanche diode 25 and self-biased transistor 26, as well happen at and around the peak of the neutral-to-line potential, current flows through avalanche diode 25 and self-biased transistor 26 as well as through the emitter-to-collector path of transistor 27 in current mirror configuration with transistor 26. The collector current of transistor 27 overcomes the pull-down current demanded by current source 28 and makes the gate potential of FET 23 more positive. The channel of FET 23 becomes conductive and the threshold detector 20 can deliver gate signal to controlled rectifier to render it conductive. Making 24b larger in resistance relative to 24a will increase that portion of the half cycle of neutral-to-line potential over which FET 23 is conductive, and resistor 24b may be replaced by an open-circuit in some designs.

At times around the zero crossings of the neutral-to-line potential, the serial connection of avalanche diode 25 and self-biased transistor 26 will not be biased into conduction and transistor 27 will not be biased into conduction. Source 28 will pull down the gate electrode of FET 23 and render its channel non-conductive. Resistor 29 will hold the gate electrode of controlled rectifier 22 at the same potential as its cathode.

The foregoing arrangement prevents initiation of conduction of controlled rectifier 22 early in each half cycle of actuating current as well as late. There is no operating advantage in inhibiting initiation of conduction of controlled rectifier 22 early in each half cycle; it is just simpler to design a circuit that inhibits initiation of conduction early as well as late in each half cycle.

FIG. 2 shows an alternative way in which application of gate signal to controlled rectifier 22 can be inhibited during the rapidly collapsing portion of the actuating current half cycle. Since the threshold detector 20 usually comprises a comparator 20', one can modulate the threshold level which must be exceeded before that gate signal can be generated, raising the threshold level during the rapidly collapsing portion of the actuating current half cycle.

Peak detector 30 comprising diode 31 and storage capacitor 32 develops a direct potential substantially equal to the offset potential appearing across avalanche diode 33 and one of diodes 34 and 35 when they are rendered conductive by the line-to-neutral potential between lines 12 and 13 being coupled to them via resistor 36. At times around zero crossings of the neutral-to-line potential between conductors 12 and 13, transistor 27 is non-conductive and provides no collector current to develop the potential drop across resistor 37 necessary to bias transistor 38 into conduction. Absent conduction of transistor 38, the direct-potential appearing across storage capacitor 32 is applied without substantial attenuation via resistor 39 to voltage comparator 20 to present a relatively high threshold level. This threshold level can be sufficiently high that it cannot be exceeded by the maximum available signal from integrator 19, so that at these times around the zero crossings of the actuating current, gate signal will not be applied to controlled rectifier 22 to initiate conduction thereof.

During other portions of the actuating half cycle, around peaks thereof, transistor 27 is conductive and provides collector current sufficient to increase the potential drop across resistor 37 and to bias transistor 38 into saturation. In the saturation condition, transistor 38 has its collector electrode clamped close to its emitter electrode in potential, so then the potential appearing across storage capacitor 32 is divided by the potential divider action of resistors 39 and 40 to provide a lowered threshold level to comparator 20'. This relatively low threshold level is more easily exceeded by the integrated signal from integrator 19, facilitating application of gate signal to controlled rectifier 22 should a ground fault exist.

Design modifications are possible in which the threshold level, while increased around zero crossings of the actuating current, does not completely preclude application of gate signal to controlled rectifier 22. Application of gate signal to controlled rectifier 22 is permissible if the ground fault is sufficiently severe that remnant integrated signal will assuredly initiate conduction of controlled rectifier 22 early in the next following attenuation half cycle of actuating current. Provided with the foregoing disclosure, one skilled in the art of electronic design will be able to construct a great variety of alternative circuits for carrying out the teaching of this disclosure, and this should be borne in mind when construing the scope of the following claims.

What is claimed is:

1. In a ground fault interrupter apparatus for use with a plurality of a-c line conductors, connecting an a-c generator to a load, which apparatus has an electromechanical relay switch for interrupting flow through said a-c line conductors responsive to application of an actuating current; an actuating signal supply dependent on potential between a pair of said a-c line conductors; a controlled rectifier means having a controlled conduction path which selectively connects said actuating signal supply to said relay switch for causing said actuating current to flow and having a gate electrode; differential current sensing means for providing a transformed imbalance current when currents flowing from the generator to the load differ from currents returning from the load to the generator; means for rectifying said imbalance current to obtain a rectified signal; means for integrating said rectified signal to obtain an integrated signal; and threshold detecting means for detecting when said integrated signal exceeds a threshold value to provide a gate signal to the gate electrode of said controlled rectifier means to initiate conduction in its controlled conduction path, the improvement comprising:

means for inhibiting the application of gate signal to said controlled rectifier means during the rapidly collapsing portions of the actuating signal.

2. An improved ground fault interrupter apparatus as set forth in claim 1 wherein said threshold detecting means comprises a threshold detector for detecting when said integrated signal exceeds a predetermined fixed threshold level to provide at an output circuit thereof a ground fault indication and wherein said means for inhibiting application of gate signal comprises a switch for de-coupling the output circuit of said threshold detector for the gate electrode of said controlled rectifier means during the rapidly collapsing portions of half-cycles of one polarity of the actuating signal and for coupling the output circuit of said threshold detector to the gate electrode of said controlled rectifier means during those portions of said half cycles of one polarity of the actuating signal around the peaks of those half cycles.

3. An improved ground fault detector apparatus as set forth in claim 1 wherein said threshold detecting means comprises a voltage comparator for comparing said integrated signal to a threshold signal and responding to said integrated signal exceeding said threshold signal to provide said gate signal to the gate electrode of said controlled rectifier means and wherein said means for inhibiting application of gate signal comprises means responsive to the potential between a pair of said a-c line conductors being less than a predetermined value to apply a relatively high value of threshold signal to said voltage comparator and responsive to the potential between the same said pair of a-c line conductors being more than said predetermined value to apply a relatively low value of threshold signal to said voltage comparator.

4. In a ground fault interrupter apparatus for use with a plurality of a-c line conductors, connecting an a-c generator to a load, which apparatus has an electromechanical relay switch for interrupting flow through said a-c line conductors responsive to application of an actuating current; an actuating signal supply dependent on potential between a pair of said a-c line conductors; a controlled rectifier means having a controlled conduction path which selectively connects said actuating signal supply to said relay switch for causing said actuating current to flow and having a gate electrode; differential current sensing means for providing a transformed imbalance current when currents flowing from the generator to the load differ from currents returning from the load to the generator; means for rectifying said imbalance current to obtain a rectified signal; means for integrating said rectified signal to obtain an integrated signal; and threshold detecting means for detecting when said integrated signal exceeds a threshold value to provide a gate signal to the gate electrode of said controlled rectifier means to initiate conduction in its controlled conduction path, the improvement comprising:
means for inhibiting the application of gate signal to said controlled rectifier means during the end portions of half cycles of one polarity of the actuating signal.

5. An improved ground fault interrupter apparatus as set forth in claim 4 wherein said threshold detecting means comprises a threshold detecting means comprises a threshold detector for detecting when said integrated signal exceeds a predetermined fixed threshold level to provide at an output circuit thereof a ground fault indication and wherein said means for inhibiting application of gate signal comprises a switch for de-coupling the output circuit of said threshold detector for the base electrode of said controlled rectifier means during the end portions of half cycles of one polarity of the actuating signal and for otherwise coupling the output circuit of said threshold detector to the base electrode of said controlled rectifier means.

6. An improved ground fault detector apparatus as set forth in claim 1 wherein said threshold detecting means comprises a voltage comparator for comparing said integrated signal to a threshold signal and responding to said integrated signal exceeding said threshold signal to provide said gate signal to the gate electrode of said controlled rectifier means and wherein said means for inhibiting application of gate signal comprises means responsive to the potential between a pair of said a-c line conductors being less than a predetermined value to apply a relatively high value of threshold signal to said voltage comparator and responsive to the potential between the same pair of a-c line conductors being more than said predetermined value to apply a relatively low value of threshold signal to said voltage comparator.

* * * * *